(12) United States Patent
Calfee

(10) Patent No.: US 9,615,472 B1
(45) Date of Patent: Apr. 4, 2017

(54) PRELOAD ANCHORING MECHANISM WITH TOP CAP ADAPTED TO RECEIVE SUBSYSTEMS, CONTROLS, INDICATORS, AND THE LIKE

(71) Applicant: Craig Calfee, Watsonville, CA (US)

(72) Inventor: Craig Calfee, Watsonville, CA (US)

( * ) Notice: Subject to any disclaimer, the term of this patent is extended or adjusted under 35 U.S.C. 154(b) by 531 days.

(21) Appl. No.: 14/183,509

(22) Filed: Feb. 18, 2014

Related U.S. Application Data

(60) Provisional application No. 61/878,188, filed on Sep. 16, 2013.

(51) Int. Cl.
    *B62J 9/00*     (2006.01)
    *H05K 5/02*     (2006.01)

(52) U.S. Cl.
    CPC .................................. *H05K 5/0217* (2013.01)

(58) Field of Classification Search
    CPC ..... B62J 99/00; B62J 11/00; B62J 6/16; B62J 6/18; B62J 6/00; B62J 6/001; B62J 2099/0006; B62J 2099/0013; B62J 2099/004; B62J 2099/0046; B62K 21/04; B62K 21/06; B62K 21/14; B62K 21/16; B62K 21/18
    USPC ............. 280/288.4; 224/420; 411/24, 25, 26
    See application file for complete search history.

(56) References Cited

U.S. PATENT DOCUMENTS

| | | | | |
|---|---|---|---|---|
| 3,009,747 A | * | 11/1961 | Pitzer | F16D 1/094 188/67 |
| 3,432,214 A | * | 3/1969 | Cashman | F16C 11/02 384/292 |
| 4,435,983 A | * | 3/1984 | Shimano | B62K 21/12 280/304.5 |
| 4,466,629 A | * | 8/1984 | Sinyard | B62K 21/06 280/279 |
| 5,319,993 A | * | 6/1994 | Chiang | B62K 21/06 280/279 |
| 5,387,255 A | * | 2/1995 | Chiang | B62K 21/06 280/279 |

(Continued)

OTHER PUBLICATIONS

Website for GPSWOX.com Bicycle GPS Tracker—Coban 305 (dated 2015)—http://www.gpswox.com/en/gps-trackers-shop/bicycle-gps-tracker-coban-305-15 (Coban_305).

(Continued)

*Primary Examiner* — Joseph Rocca
*Assistant Examiner* — Conan Duda
(74) *Attorney, Agent, or Firm* — Jonathan A. Small

(57) ABSTRACT

An apparatus for removably securing an electrical element within a tubular steerer tube within a frame element consists of a canister for housing the electrical element, an expandable sleeve, and an expansion bolt coupling the canister and expandable sleeve to actuate compression of the expandable sleeve thereby securing the assembly within the tubular steerer tube. A preload cap is secured to the assembly to retain a bearing system to permit the steerer tube to rotate relative to the frame. One or more of a light, switch, and connector may be disposed in the preload cap to provide system conditions, controls, charging, communication, and so on. In certain embodiments, requirements for a central extension bolt extending from preload cap to expansion bolt are obviated, providing a relatively uninterrupted volume within the steerer tube in which to house electronics, route wiring, and so on.

19 Claims, 11 Drawing Sheets

(56) References Cited

U.S. PATENT DOCUMENTS

| | | | | |
|---|---|---|---|---|
| 5,540,457 | A * | 7/1996 | Johnson | B62K 21/06 280/279 |
| 5,647,684 | A * | 7/1997 | Chen | B62K 21/06 280/279 |
| 5,678,836 | A * | 10/1997 | Chen | B62K 21/18 280/276 |
| 5,810,380 | A * | 9/1998 | Lin | B62K 21/06 280/279 |
| 5,813,769 | A * | 9/1998 | Chueh | B62K 21/06 384/513 |
| 5,918,895 | A * | 7/1999 | Chi | B62K 21/06 280/279 |
| 5,971,415 | A * | 10/1999 | Lin | B62K 21/06 280/280 |
| 6,126,323 | A * | 10/2000 | Tange | B62K 21/06 280/279 |
| 6,234,506 | B1 * | 5/2001 | Li | B62K 21/06 280/280 |
| 6,394,692 | B1 * | 5/2002 | Lin | B62K 21/06 280/279 |
| 6,497,425 | B1 * | 12/2002 | Tange | B62K 21/06 280/279 |
| 6,523,847 | B1 * | 2/2003 | Chien | B62K 21/22 280/279 |
| 6,651,525 | B2 * | 11/2003 | Jiang | B62K 21/06 280/279 |
| 6,729,634 | B2 * | 5/2004 | Tange | B62K 21/06 280/279 |
| 6,742,966 | B2 * | 6/2004 | Cook | E21D 21/008 405/259.3 |
| 6,892,604 | B2 * | 5/2005 | Tison | B62K 21/06 280/279 |
| 6,983,949 | B2 | 1/2006 | Ueno et al. | |
| 7,000,936 | B2 * | 2/2006 | Schmider | B62K 21/00 280/281.1 |
| 7,017,929 | B2 | 3/2006 | Horiuchi et al. | |
| 7,093,844 | B2 | 8/2006 | Horiuchi | |
| 7,192,044 | B2 | 3/2007 | Ueno | |
| 7,204,349 | B2 * | 4/2007 | Goring | B62M 25/02 188/24.11 |
| 7,204,502 | B2 * | 4/2007 | Tange | B62K 21/06 280/276 |
| 7,341,269 | B2 | 3/2008 | Horiuchi | |
| 7,396,032 | B2 | 7/2008 | Horiuchi | |
| 7,757,820 | B1 * | 7/2010 | Wu | B62K 21/18 188/24.11 |
| 7,896,380 | B2 * | 3/2011 | Tange | B62K 21/06 280/276 |
| 8,052,346 | B2 * | 11/2011 | Lin | B62K 21/06 280/280 |
| 8,302,981 | B1 | 11/2012 | Ma | |
| 8,651,350 | B2 | 2/2014 | Onogi | |
| 8,662,517 | B2 * | 3/2014 | King | B62K 21/06 280/270 |
| 8,979,111 | B2 * | 3/2015 | Dal Pozzo | B62J 11/00 180/68.5 |
| 9,010,789 | B1 * | 4/2015 | Wang | F16C 1/103 188/24.21 |
| 9,056,646 | B1 * | 6/2015 | D'Aluisio | B62K 19/30 |
| 9,126,646 | B2 * | 9/2015 | Kuo | B62J 6/00 |
| 9,242,692 | B2 * | 1/2016 | Nago | B62K 21/12 |
| 2003/0230228 | A1 * | 12/2003 | Kinoshita | B62J 99/00 116/28 R |
| 2005/0057017 | A1 * | 3/2005 | Hara | B62K 21/12 280/279 |
| 2012/0200061 | A1 * | 8/2012 | D'Aluisio | B62L 3/02 280/281.1 |
| 2013/0154234 | A1 * | 6/2013 | Shadwell | B62J 99/00 280/279 |
| 2013/0241170 | A1 * | 9/2013 | Talavasek | B62M 6/90 280/279 |

OTHER PUBLICATIONS

Website for GPSWOX.com Bicycle GPS Tracker—Coban 305 (dated 2013)—http://www.coban.net/html/2013/12/26/2013122605122319508635.html (Coban_305_1).

* cited by examiner

PRELOAD ANCHORING MECHANISM WITH TOP CAP ADAPTED TO RECEIVE SUBSYSTEMS, CONTROLS, INDICATORS, AND THE LIKE

CROSS-REFERENCE TO RELATED APPLICATIONS

The present disclosure is related to and claims priority from Provisional U.S. Patent Application Ser. No. 61/878,188, filed on Sep. 16, 2013, which is incorporated in its entirety herein by reference.

BACKGROUND

The present disclosure is related to subsystems for applications such as bicycles, motorcycles, and the like, and more specifically to subsystems that can be disposed within the steerer tube of such cycles.

Application relative to bicycles will be used an example herein, it being understood that the present disclosure is generally not limited to such. A steerer tube of a bicycle is generally an extension of the forks (front wheel mounts) that swivels on a bearing (headset) to permit steering the bicycle. In certain cases, the steerer tube is an auxiliary tubular section that fits into or is otherwise secured to or forms a part of a portion of the forks. In the past, the stem of a bicycle (that retains the handlebars) fit within the steerer tube, and locked thereto with an expansion bolt. However, in many modern systems, the steerer tube extends above the plane of the bicycle's top tube, and the stem is configured to clamp around the steerer tube. The steerer tube remains generally hollow, and is most often provided with a cap to preload (clamp, perpendicular to the plane of rotation of) headset bearings and help prevent them from coming loose over time (as well as prevent moisture, dirt, etc. from entering the steerer tube). Caps generally friction-fit or are provided with a bolt or other mechanism to secure them to the inside of the steerer tube.

There is a growing interest in and availability of electronic bicycle components that replace traditionally mechanical, manual components. For example, several companies now produce and sell electronic shifting systems. These components require battery power, supplied by a battery disposed on or within the bicycle frame or components such as a seat post. These components also require control system, often formed on circuit boards, also disposed on or within the bicycle frame or components.

In order to support emerging electronic components and systems, improvements to methods and systems for disposing controls, indications, charging, and other electronic subsystems on a bicycle are needed. Specifically, the hollow of a steerer tube and the cap disposed therein are convenient and appropriate elements on which to focus. However, existing methods and systems for securing electronic components within a steerer tube have proven inadequate. For example, certain known systems depend on a bolt extending through the center of the structure which is used to compress and preload the bearings, as in a traditional headset. This limits the size and shape of the space available for components to be disposed within the steerer tube. In other designs, routing of electrical wiring is a challenge or even precluded, such as by conic expansion bolts, rotation of the structure in the process of securing it within the steerer, and other mechanical and spatial limitations. Improvements are needed.

SUMMARY

According to the present disclosure, a generally cylindrical tube may be fitted within the steerer tube of a bicycle fork. This tube houses electrical subsystems, such as circuit boards, that are typically used on electronic bicycle components, such as shifting systems. This circuitry may control the actual actuation (e.g., shifting) mechanism and/or the charging of a battery, which may also be disposed in the steerer tube (or elsewhere on the bicycle).

Generally, an apparatus is provided for removably securing an electrical element within a tubular member within a frame element, the apparatus comprising: an assembly that includes a canister for receiving the electrical element, the canister having a first end section having a substantially tapered cross-section; an expandable sleeve, the expandable sleeve having a first end section having a substantially tapered cross-section configured to receive the first end section of the canister; an expansion bolt configured and disposed to couple the canister and the expandable sleeve such that the expansion bolt may actuate compression of the expandable sleeve between the canister and the expandable sleeve to thereby enable securing of the assembly within the tubular member; and a preload cap, secured to the assembly such that the preload cap may engage and retain a bearing system to permit the tubular member to rotate relative to the frame element.

According to various examples disclosed herein, the expansion bolt is securely affixed to (or formed as a portion of) the first end of the canister, and the assembly further comprises an expansion nut that has a first end having a substantially tapered cross-section, the expandable sleeve has a second end, opposite the first end, having a tapered cross-section configured to receive the first end of the expansion nut. The canister may further comprise a second end opposite the first end, the second end including at least one electrical connector to provide communicative coupling to the electrical element. Further, each of the first end of the canister and the expansion washer comprise at least one wire routing recess for receiving therein electrical wiring such that when the assembly is disposed within the tubular member the electrical wiring may pass from the canister through the wire routing recesses and exit between the expansion washer and the preload cap for providing communicative coupling to the electrical element.

According to other examples, the canister further comprises a second end comprising a threaded portion and further wherein the preload cap comprises a threaded region configured to engage the threaded portion of the second end of the canister to thereby retain the preload cap relative to the assembly. The canister may include a central body portion disposed between the first and second ends. The apparatus may further comprise a cap ring disposed between the preload cap and a central body portion. The cap ring may optionally have disposed therein either or both of a set screw receiving region for receiving a set screw to retain said cap ring in a desired position relative to said assembly and/or an electrical cable receiving region for receiving electrical wiring for providing communicative coupling to the electrical element.

In various examples disclosed herein, the second end of the canister may include: an indicator region having disposed therein at least one indicator configured to be communicatively coupled to the electrical element; at least one switch configured to be communicatively coupled to said electrical element; at least one communications port configured to be communicatively coupled to said electrical element; a charging connector for charging a power supply communicatively coupled to said electrical element; at least one tool receiving recess configured and disposed therein to receive a tool for rotating said canister relative to said expansion nut to permit actuating said expandable sleeve to secure said assembly within said tubular member.

According to other examples disclosed herein, first and second expansion washers are provided, each having a first end having a substantially tapered cross-section. The first expansion washer may be secured to the canister or be integrally formed therewith or therein. The expandable sleeve has first and second ends, located opposite on another, each having a tapered cross-section configured to receive the first ends of the first and second expansion washers, respectively. Either the canister or first expansion washer may comprise a threaded bolt receiving region configured to receive the expansion bolt.

In certain examples, the preload cap comprises a cap bolt and a compression body, and the expansion bolt has an internal threaded region configured to receive the cap bolt, such that the cap bolt may secure the compression body to the assembly relative to the frame element by engaging the internal threaded region of the expansion bolt when the assembly is secured to the tubular member and thereby retain a bearing assembly relative to the frame element to permit the tubular member to rotate relative to the frame element. At least one wire routing recess may be provided for receiving therein electrical wiring such that when the assembly is disposed within the tubular member the electrical wiring may pass from the canister through the wire routing recesses and exit between the expansion washer and the preload cap for providing communicative coupling to the electrical element.

The above is a brief summary of a number of unique aspects, features, and advantages of the present disclosure. The above summary is provided to introduce the context and certain concepts relevant to the full description that follows. However, this summary is not exhaustive. The above summary is not intended to be nor should it be read as an exclusive identification of aspects, features, or advantages of the claimed subject matter. Therefore, the above summary should not be read as imparting limitations to the claims nor in any other way determining the scope of said claims.

BRIEF DESCRIPTION OF THE DRAWINGS

The drawings accompanying this description form a part of this disclosure, and further illustrate the concepts described above. In the drawings like reference numerals denote like elements between the various drawings. While illustrative, the drawings are not drawn to scale. In the drawings.

DETAILED DESCRIPTION

We initially point out that descriptions of well-known starting materials, processing techniques, components, equipment and other well-known details may merely be summarized or are omitted so as not to unnecessarily obscure the details of the present disclosure. Thus, where details are otherwise well-known, we leave it to the application of the present disclosure to suggest or dictate choices relating to those details.

Figure 1:
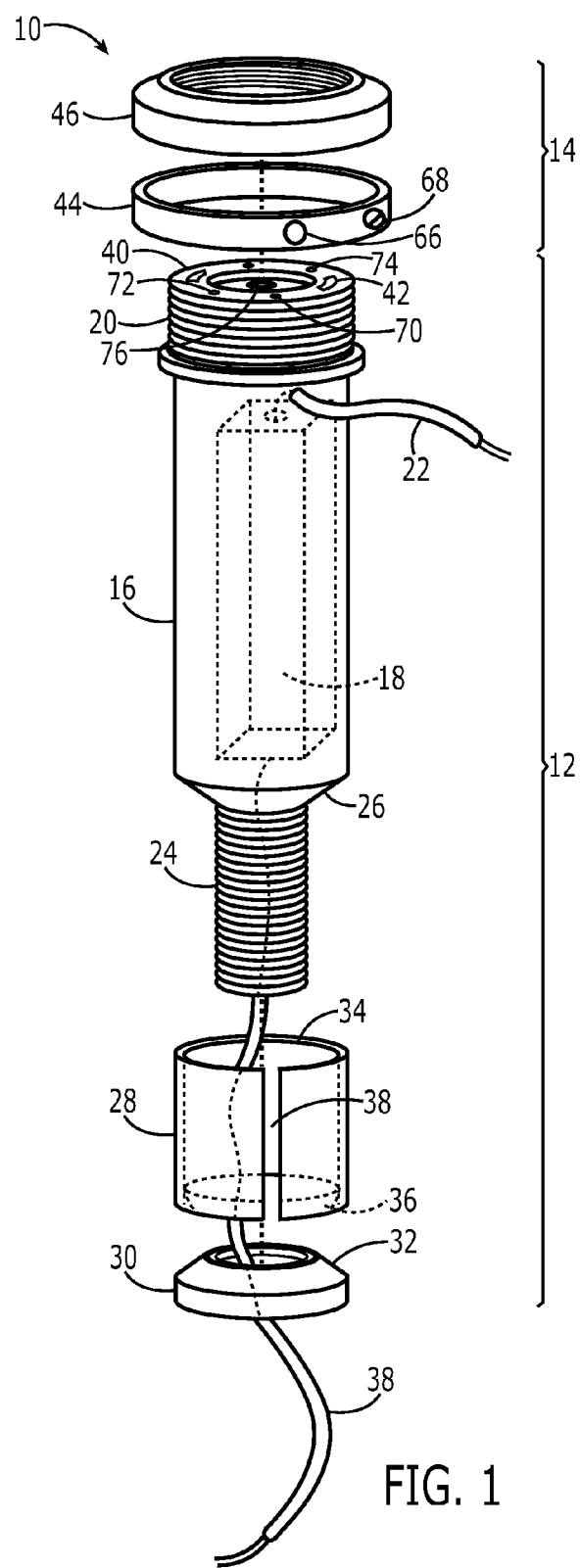
FIG. 1 is a perspective view of an apparatus for removably securing an electrical element within a tubular member within a frame element according to an embodiment of the present disclosure.

An apparatus for removably securing an electrical element within a tubular member, such as a steerer tube within the head tube of a bicycle frame, of a type disclosed and claimed herein may be realized through one of many possible arrangements, several of which being described in detail here. A first example embodiment 10 is illustrated in FIG. 1. Embodiment 10 consists of a canister and retention assembly 12 and preload assembly 14. Canister and retention assembly 12 consists of canister 16 within which may be removably or permanently disposed an electrical element 18 such as a control interface for an electronic shifting system, lighting system, charging system, navigation and route tracking system, smart-phone integration system, and so on. In instances in which electrical element 18 is removably disposed within canister 16, a pressure-fit, threaded engagement, or other openable connection between a threaded first end connector 20 and canister 16 may be provided to access the internal region of canister 16. In such instances, a recess or opening is provided through which electrical wiring 22, from electrical element 18, may pass.

The lower portion of canister 16 may be provided with a threaded region 24, integrally formed with canister 16 or attached thereto. Threaded region 24 may have at a distal end thereof a tapered region 26. Threaded region 24 may fit into and through a central opening in an expandable sleeve 28, and ultimately engage an expansion nut 30. Expansion nut 30 is formed to have a tapered region 32. Expandable sleeve 28 is formed to have tapered first and second ends 34, 36 to engage tapered regions 26, 32, respectively. A slot 38 or other mechanism permits expandable sleeve 28 to expand when nut 30 engages threaded region 24. When disposed within a steerer tube, this expansion enables assembly 12 to be removably secured within a steerer tube, as discussed further below.

Threaded region 24 and nut 30 each have an axial opening permitting electrical wiring 38 to pass therethrough, to permit electrical coupling to other components on the cycle (such as a derailleur system, etc.) Electrical wire 22 may similarly be connected to other components on the bicycle, such as to elements within or external to a portion of a handlebar stem and/or and handlebars, such as gear-changing switches, indicators, and so on located convenient to the rider, such as on the handlebars, brake levers, etc.

A portion of assembly 12, such as a top surface 40 of connector 20, may be provided with tool engagement tabs, pins, or recesses 42 to permit engagement of a tool (e.g., a pin spanner) for applying torque along assembly 12 relative to nut 30. This torque threads (actuates) nut 30 onto threaded region 24 to thereby apply an axial compressive force to expandable sleeve 28. Due to the relationship of tapered regions 26 and 34, as well as tapered regions 32 and 36, expandable sleeve 28 will respond to the compressive force by increasing in radius. This increase applies force against the inside of a steerer tube (when assembly 12 is disposed therein), to retain assembly 12 within the steerer tube (see, e.g., FIG. 2). Knurling, ribbing, or other surface texture applied to sleeve 28 may further assist with retaining assembly 12 in desired position. In position, canister 16 may be partially or fully disposed within a steerer tube, and a cycle stem may be secured to the steerer tube, such that canister 16 rotates together with rotation of the steerer tube. While a threaded coupling and expansion ring have been described above as a clamping mechanism, cams, ratchets, and other mechanisms may similarly be employed without departing from the scope of the present description, as will be appreciated by one skilled in the art.

Figure 2:
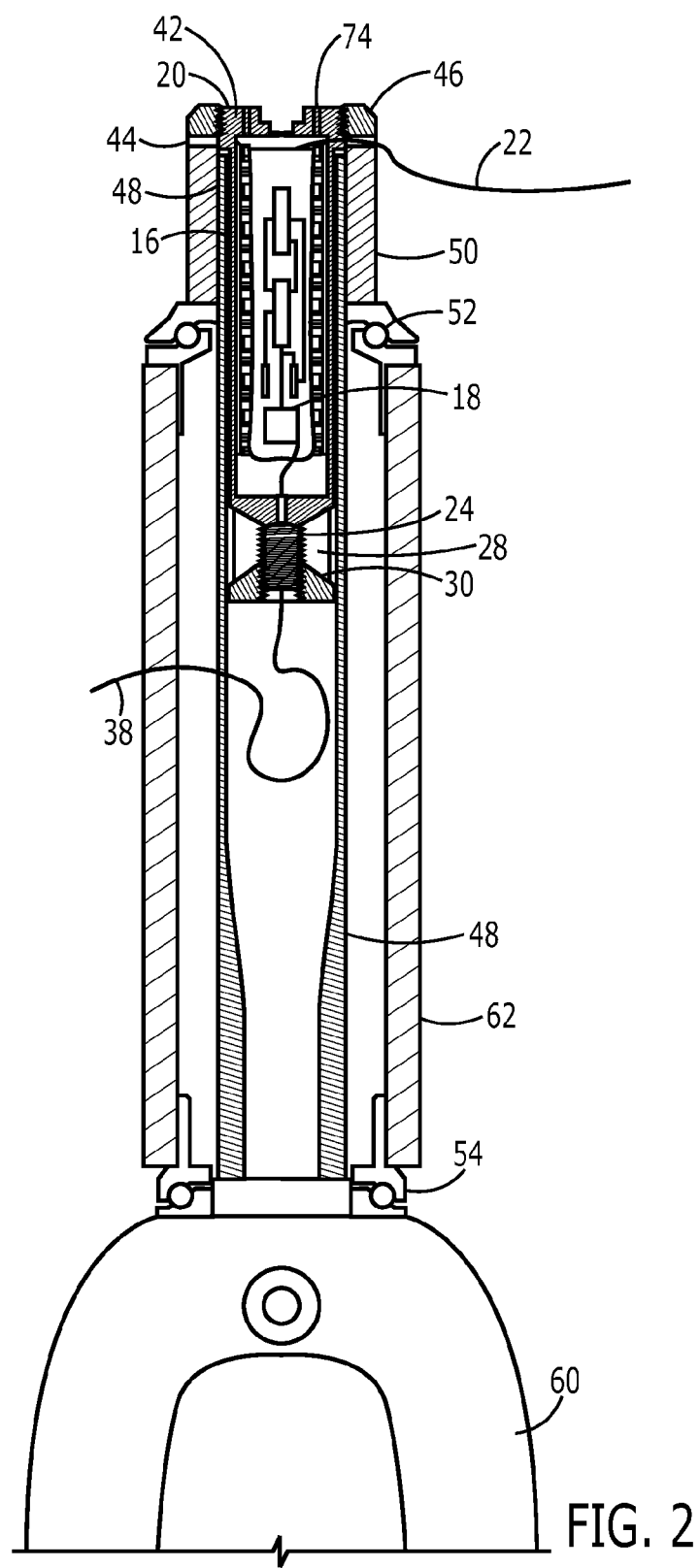
FIG. 2 is a cut-away view of a head tube, steerer tube, and apparatus including an electrical element removably secured within the steerer tube of a type shown in FIG. 1.

Preload assembly 14 consists of a cap ring 44 and preload cap 46. With reference also now to FIG. 2, threaded first end connector 20 may extend above the top of the steerer tube 48 (secured to forks 60 and disposed within frame head tube 62). A cycle stem 50 (see also FIG. 3) may be secured to steerer tube 48, and the combination of cap ring 44 and preload cap 46, by way of threaded engagement with upper threaded portion 20, may apply axial pressure via stem 50 to maintain compressive pressure on (and hence maintain functional operation of) an upper and lower headset bearing assembly 52, 54, respectively. Torque can be delivered to preload cap 46 by various means, including wrench flats, holes for a pin spanner, etc.

Figure 3:
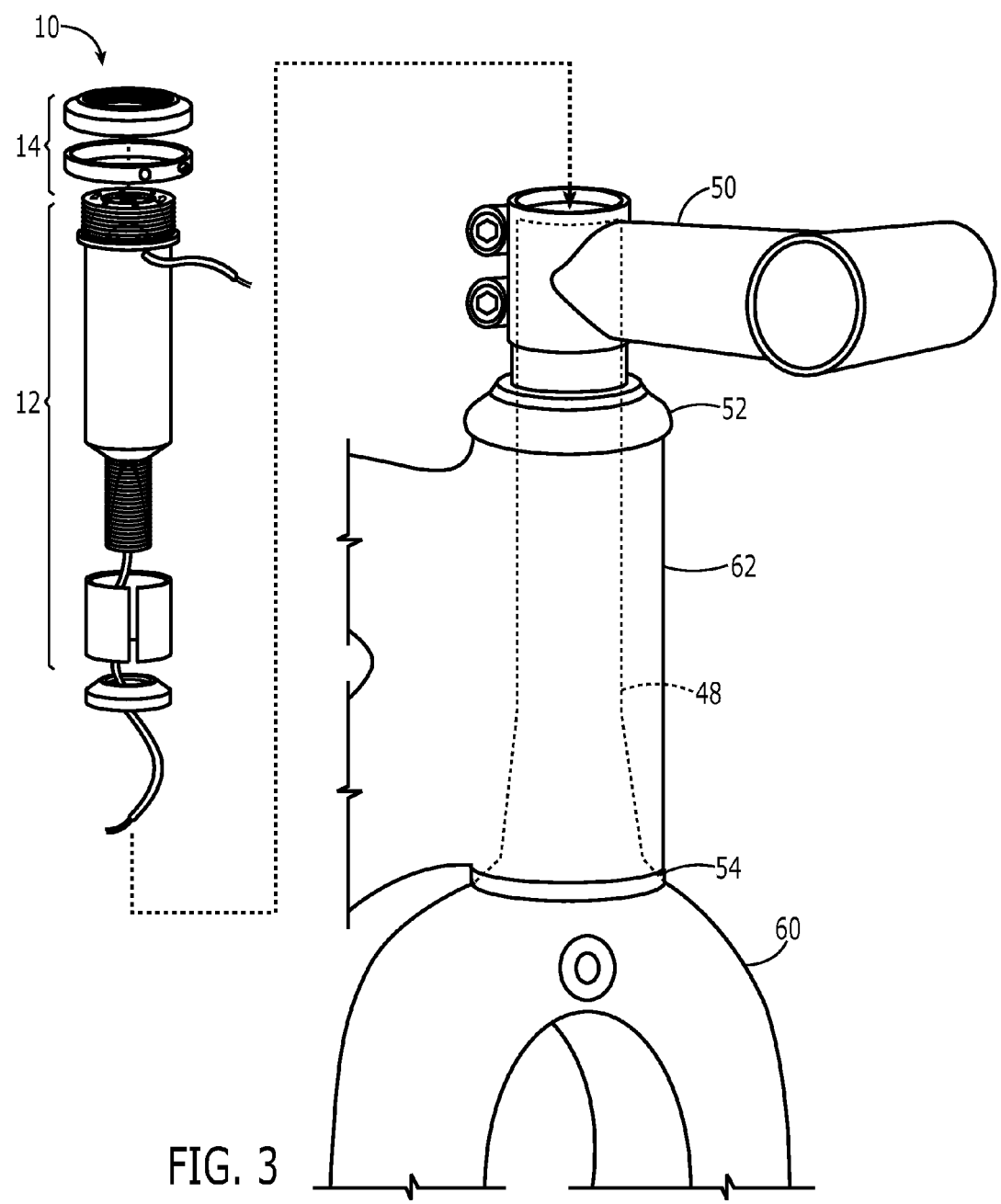
FIG. 3 is an assembly view of a head tube, steerer tube, and apparatus for removably securing an electrical element within the steerer tube of a type shown in FIG. 1.
Figure 4:
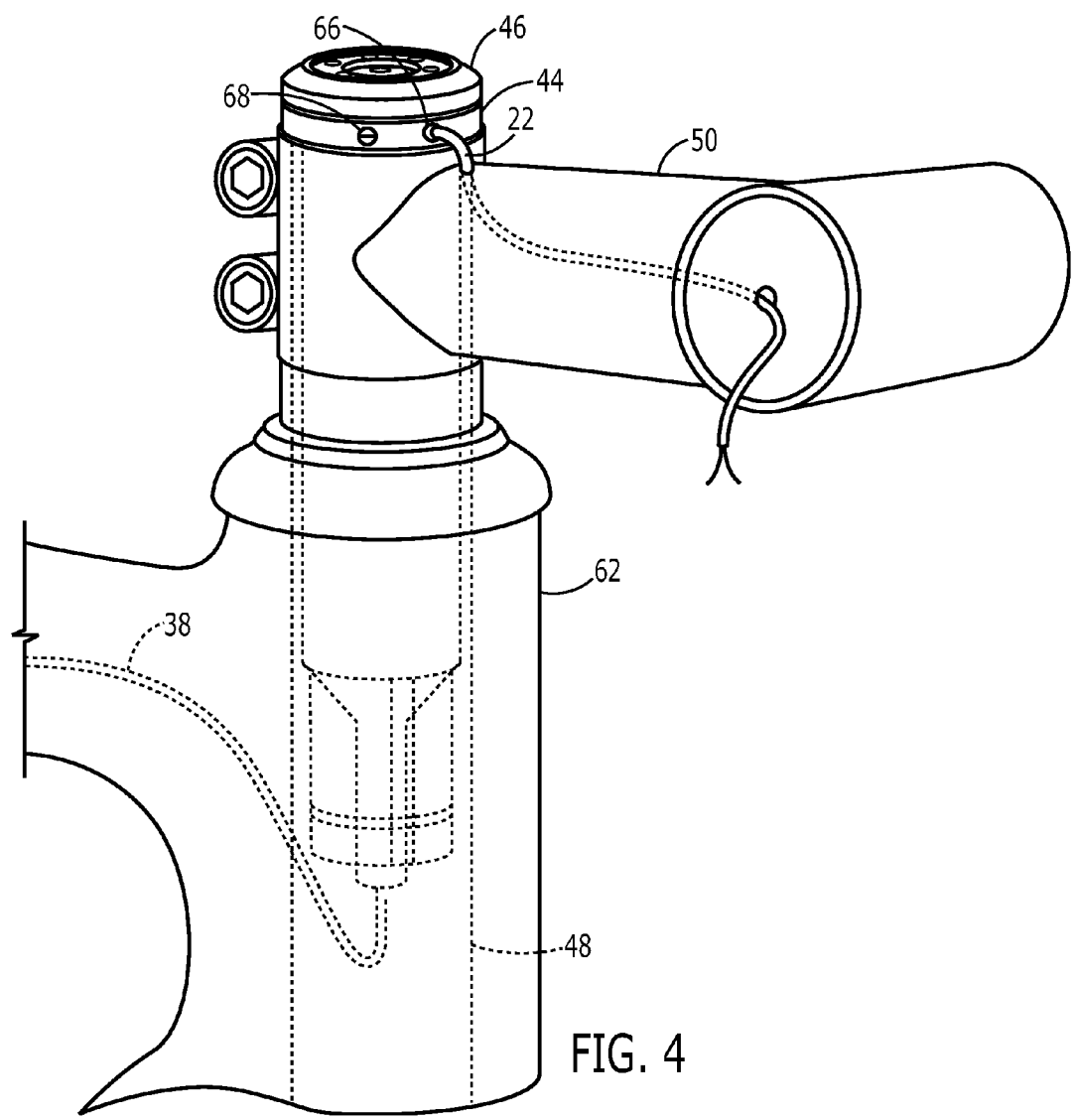
FIG. 4 is a perspective view of a head tube, steerer tube, stem, and apparatus for removably securing an electrical element within the steerer tube of a type shown in FIG. 1.

FIG. 3 illustrates the positioning of embodiment 10 within a steerer tube of a bicycle. FIG. 4 illustrates embodiment 10 following installation thereof within the steerer tube. In addition, FIG. 4 illustrates wire routing for control wires 22, 38 to and from electrical element 18. In certain embodiments, cap ring 44 may include a notch or hole 66 to permit wire 22 to pass therethrough. Wire 22 may optionally thereafter pass through a hole in stem 50, through a hole in handlebars (not shown), and emerge at controls, display or other user interface, power supply, etc. disposed on or within the handlebars. In alternative embodiment (not shown), wire 22 may be attached to the exterior surface of stem 50 and the handlebars, and otherwise connect to the aforementioned controls, display or other user interface, power supply, etc. In a still further alternative (not shown), wire 22 may pass directly through a hole in steerer tube 48 and into the backside of the stem both without exiting the cap ring 44. Thus, the embodiment illustrated in FIG. 4 is simply one of several embodiments for wire routing contemplated by the present disclosure. In certain embodiments, cap ring 44 may further include a hole 68 for a set screw or other position retaining mechanism.

Figure 5:
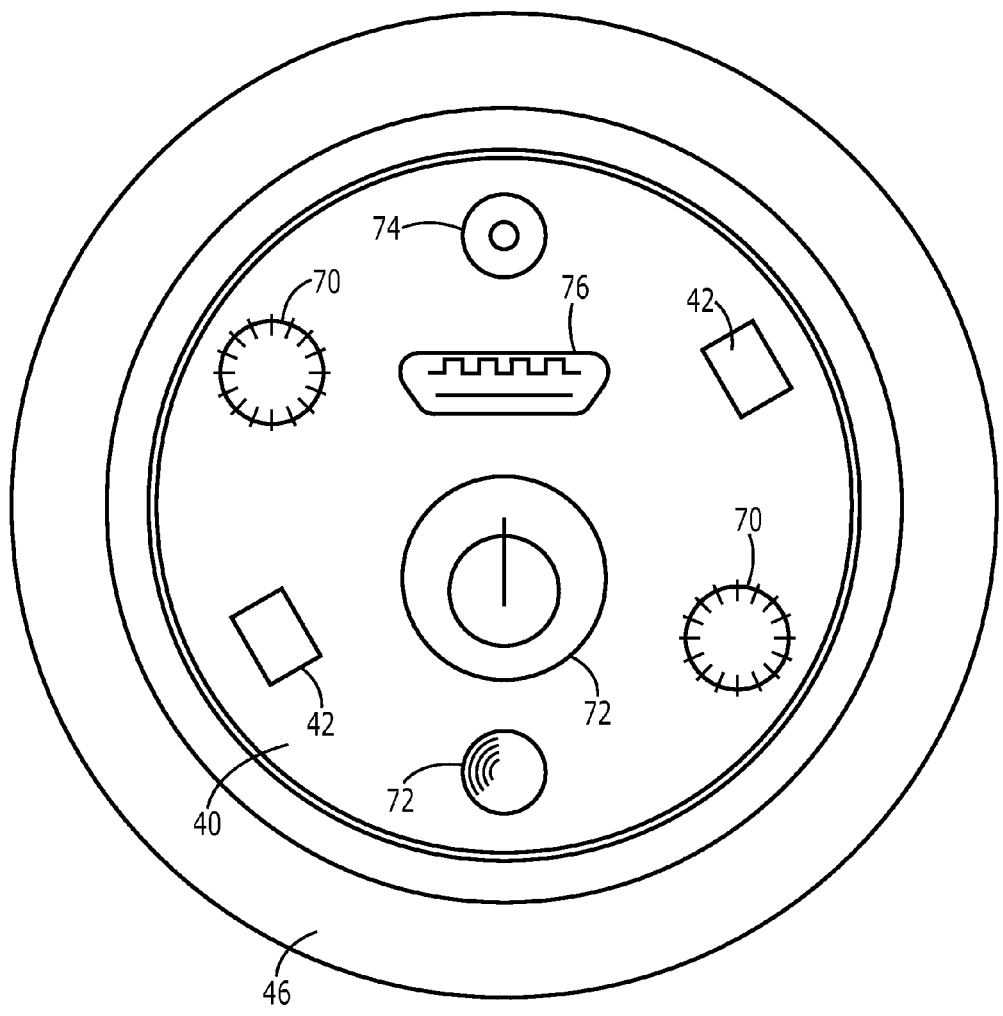
FIG. 5 is a plan-view of a top surface of an assembly for removably securing an electrical element within a steerer tube according to an embodiment of the present disclosure.

FIG. 5 is a plan- (top-) view of top surface 40 of connector 20, equipped with a number of elements including but not limited to indicator lights 70 (for example to indicate system status, which components are active, remaining battery charge, etc.), push-button switches 72 (for example to turn on/off system power, engage specific components, etc.), pin-style jacks 74 (for example for headphones, microphone, power, etc.), USB, mini-USB or other specialize jacks 76 (for example for charging power input, providing power to an external device, communication with electronics and/or memory disposed below the cap such as for uploading or downloading data, media, new or upgraded software, etc.) according to an embodiment of the present disclosure. Further, top surface 40 is provided with the aforementioned recesses 42 for receiving a pin spanner or similar tool for applying torque to assembly 12 to secure same within the steerer. It will be appreciated that the type, format, layout, location, number, etc. of any of the above lights 70, switches 72, jacks 74, 76, and recesses 42 may differ from what is shown in FIG. 4 and described herein without departing from the spirit and scope of the present disclosure.

Figure 6:
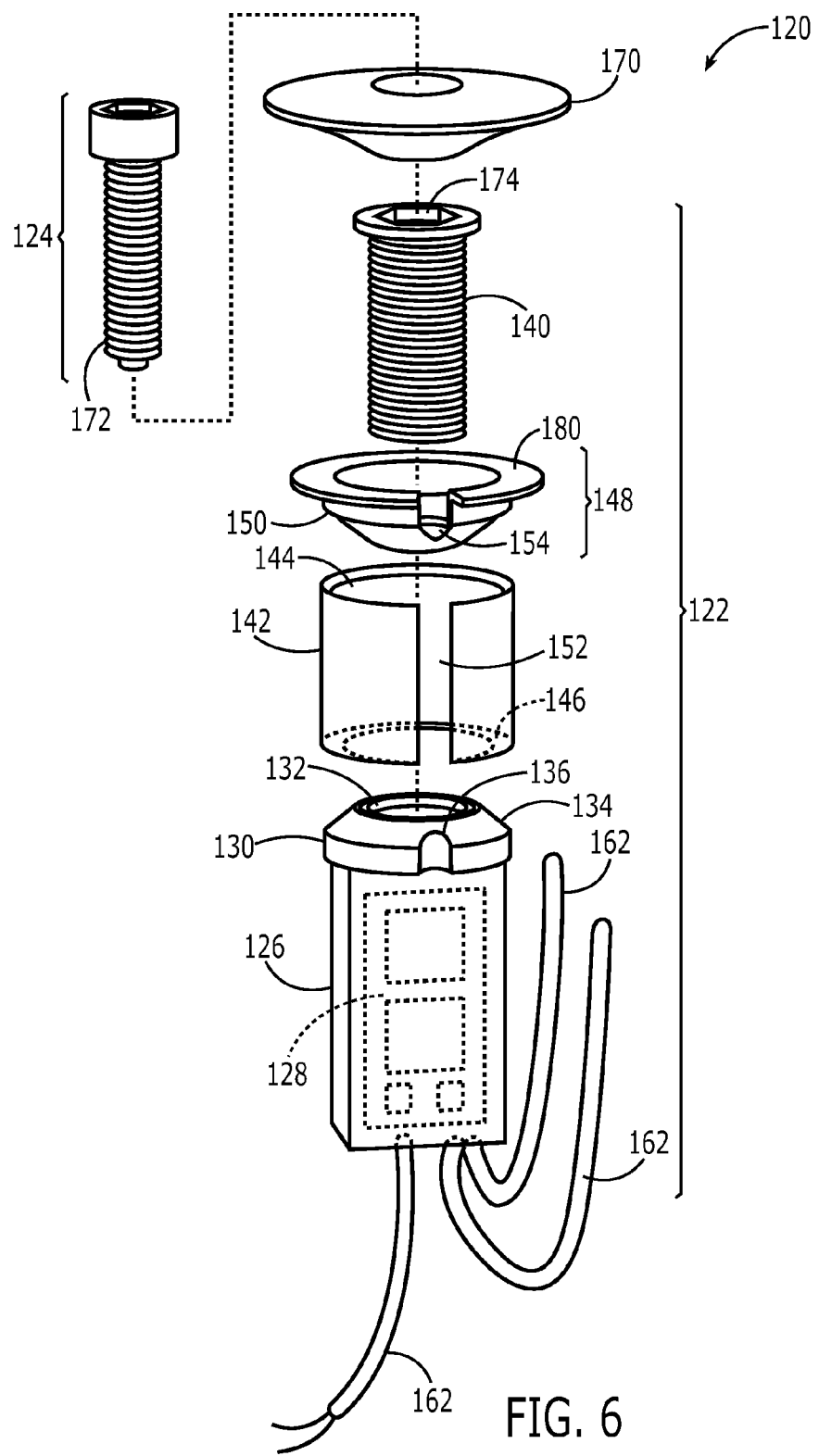
FIG. 6 is a perspective view of an apparatus for removably securing an electrical element within a tubular member within a frame element according to another embodiment of the present disclosure.

Referring next to FIG. 6, an alternate embodiment 120 of an apparatus for removably securing an electrical element within a tubular member within a frame element is shown. Embodiment 120 consists of a canister and retention assembly 122 and a preload assembly 124. Canister and retention assembly 122 consists of canister 126 within which may be removably or permanently disposed an electrical element 128 such as a control interface for an electronic shifting system, lighting system, charging system, navigation and route tracking system, smart-phone integration system, and so on.

The upper portion 130 of canister 126 may be provided with a threaded recess 132, integrally formed with canister 126 or attached thereto. Threaded recess 132 may have at a proximal end thereof a tapered region 134. A wire receiving recess 136 may be provided in upper portion 130, for receiving a control wire as discussed further below.

Assembly 122 may further include an expansion bolt 140, sized and configured to fit into and ultimately engage threaded recess 132. Assembly 122 may further include an expandable sleeve 142, formed to have tapered first and second ends 144, 146. Assembly 122 may still further include an expansion washer 148, configured to have a tapered region 150 at a first end thereof, and a stop-flange 180 at a second end thereof opposite the first end. Expansion washer 148 may be provided with a wire receiving recess 154, for receiving a control wire as discussed further below. These elements may be joined such that expansion bolt 140 passes through expandable sleeve 142 and engages into threaded recess 132. In so doing, tapered region 150 of expansion washer 148 engages tapered region 144 of expandable sleeve 142, and tapered region 134 of upper portion 130 engages tapered region 146 of expandable sleeve 142. A slot 152 or other mechanism permits expandable sleeve 142 to expand when bolt 140 engages threaded recess 132. When disposed within a steerer tube, this expansion enables assembly 122 to be removably secured within a steerer tube, as discussed further below.

Figure 7:
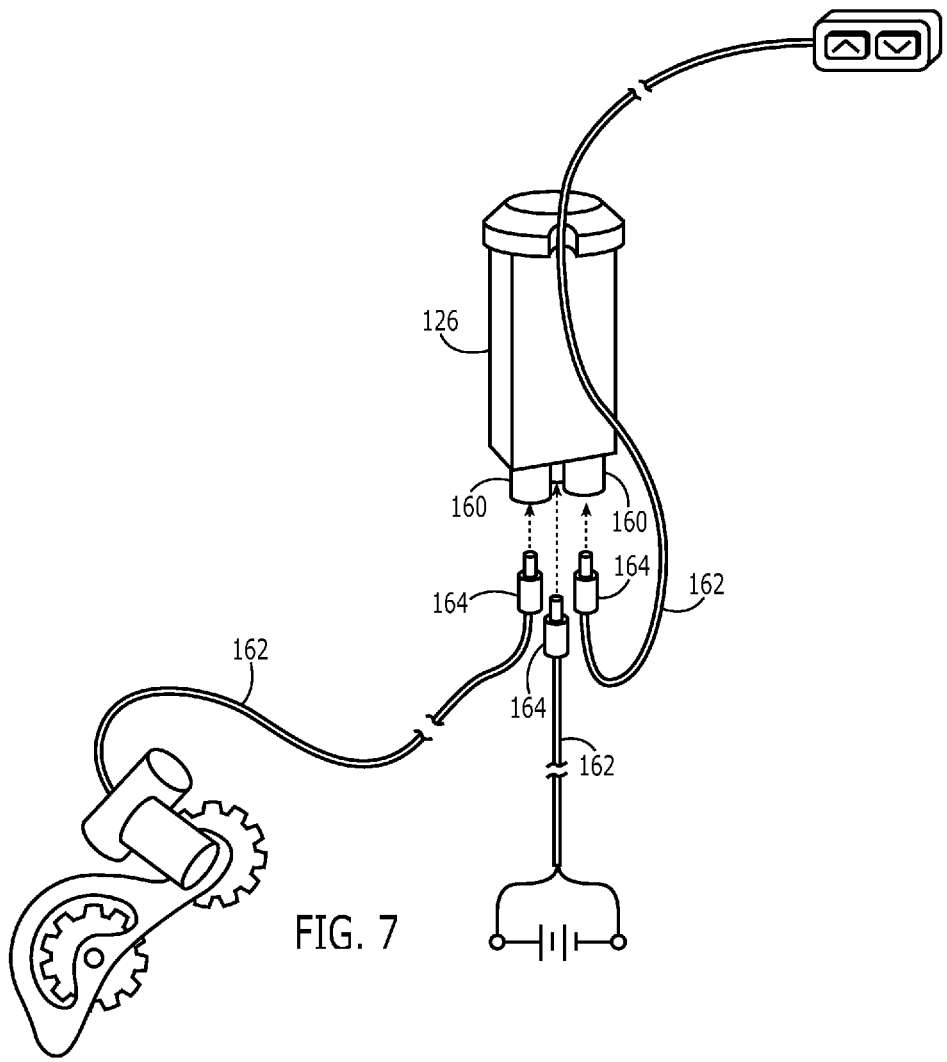
FIG. 7 is an assembly view of a portion of an apparatus for removably securing an electrical element within the steerer tube, illustrating electrical interconnection therewith, according to an embodiment of the present disclosure.

With reference also to FIG. 7, in certain embodiments, canister 126 may include connector fittings 160 permitting electrical wiring 162, having corresponding fittings 164, to be removably communicatively connected to canister 126 and the electronic components disposed therein, to permit electrical coupling to other components on the cycle (such as a derailleur system, power supplies, control elements, etc.)

Figure 8:
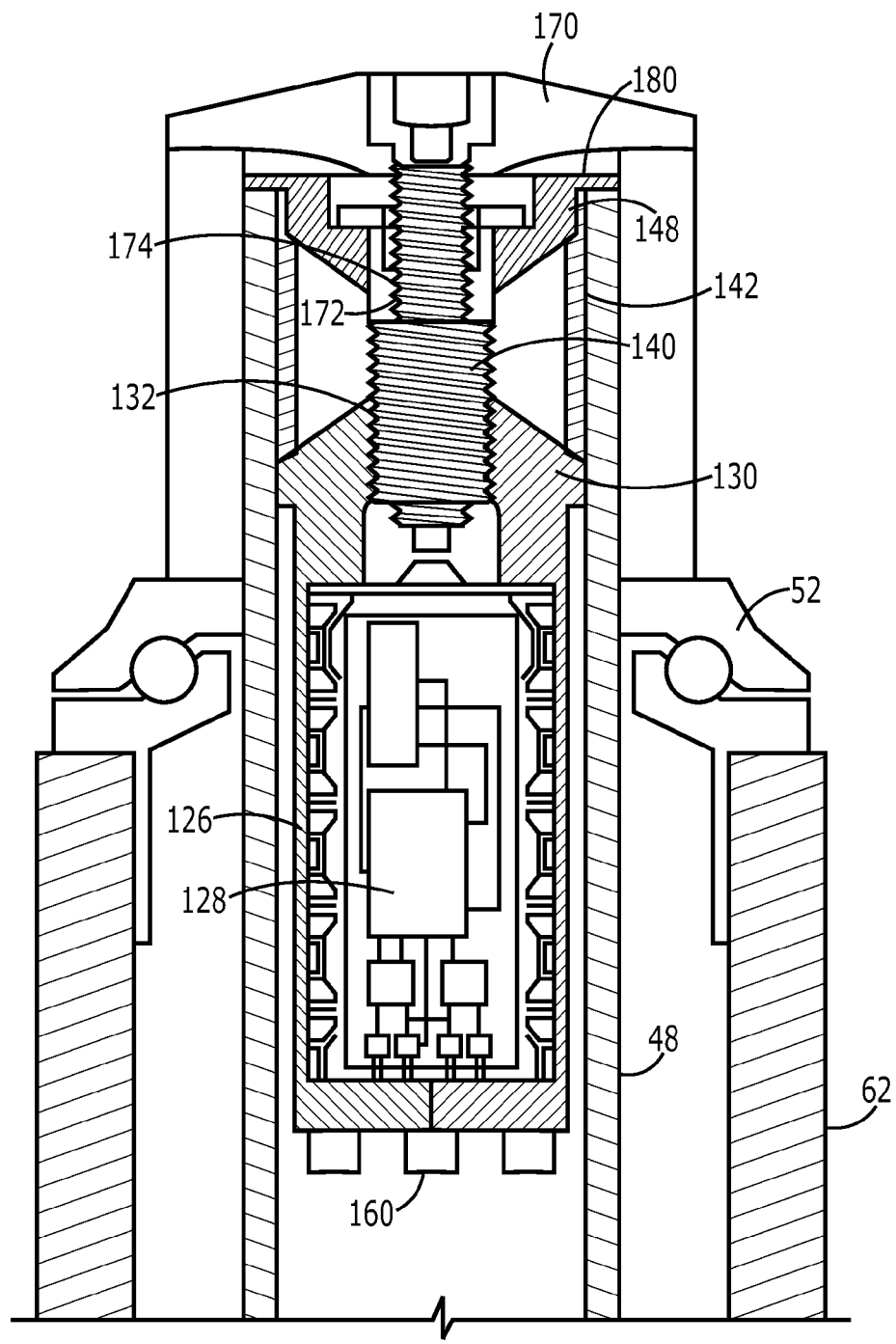
FIG. 8 is a cut-away view of a head tube, steerer tube, and apparatus including an electrical element removably secured within the steerer tube of a type shown in FIG. 7.

Returning to FIG. 6, preload assembly 124 consists of a compression cap 170 and compression cap bolt 172. Expansion bolt 140 is provided with an axially central threaded recess 174. Compression cap bolt 172 is sized and configured to engage threaded recess 174. Reference is also now made to FIG. 8, illustrating embodiment 120 installed within a steerer tube 48 of a bicycle head tube 62. Initially, expansion bolt 140 is installed through expansion washer 148 and expandable sleeve 142, into threaded recess 132. Compression cap bolt 172 is not yet installed through compression cap 170. Assembly 122 is disposed within steerer tube 48, and bolt 140 is tightened, for example by way of a hex wrench engaged into a corresponding hex opening portion of the top of bolt 140. This tightening (engaging) causes compression of expandable sleeve 142, expanding sleeve 142 against the inner wall of steerer tube 48, essentially as previously described. A cycle stem 50 may be loosely secured to steerer tube 48, as previously described. Compression cap bolt 142 is installed through a central opening in compression cap 170, and engages threaded recess 174 in expansion bolt 140. This engagement may apply axial pressure via stem 50 to maintain compressive pressure on (and hence maintain functional operation of) upper and lower headset bearing assembly 52, 54, respectively. Stem 50 may then be more tightly secured to hold the stem-headset-steerer firmly in place yet permit rotation of stem 50 (together with the forks) relative to head tube 62.

Figure 9A:
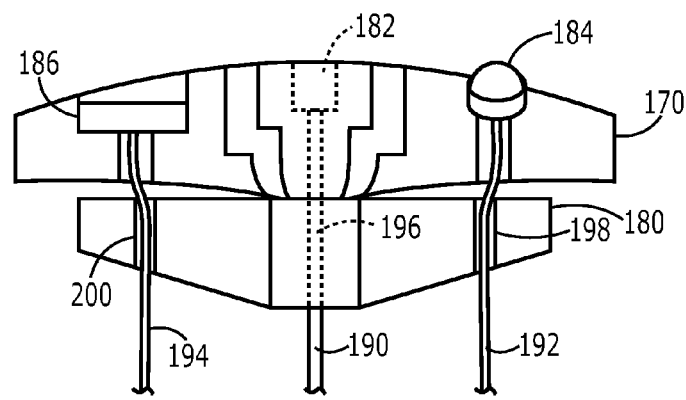
FIGS. 9A and 9B are side-view and plan-view illustrations of a compression cap of an assembly for removably securing an electrical element within a steerer tube according to an embodiment of the present disclosure.
Figure 9B:
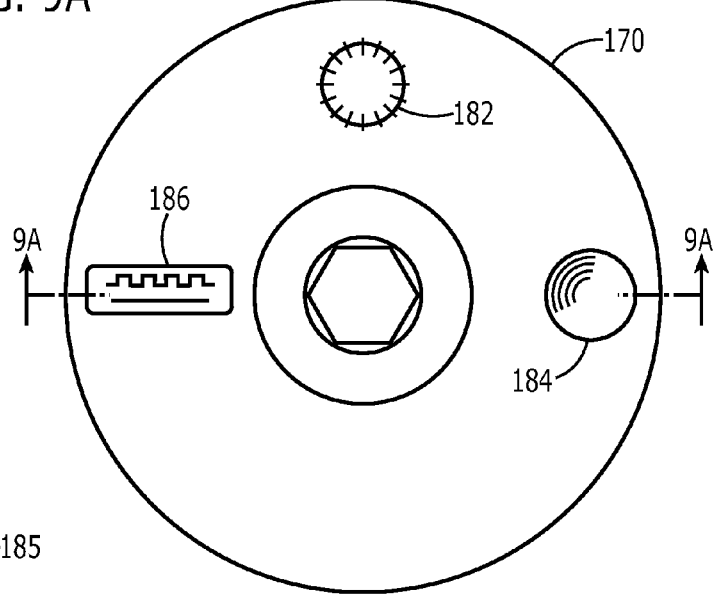
Figure 9C:
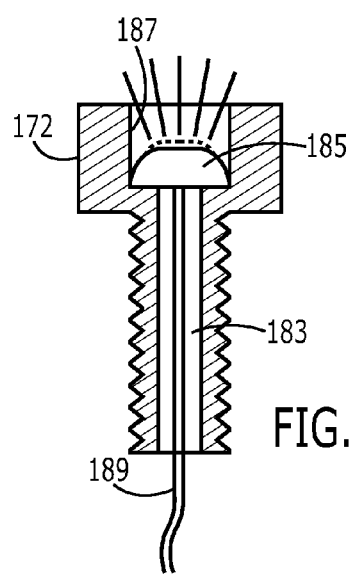
FIG. 9C is an illustration of a cap bolt and electrical element of a type associated with the compression cap shown in FIGS. 9A and 9B.

FIG. 9A is a side view and FIG. 9B is a plan- (top-) view of compression cap 170, equipped with a number of elements including but not limited to indicator lights 182, push-button switch 184 (for example to turn on/off system power, engage specific components, etc.), and jack 186 (for example a mini-USB jack for charging power input, providing power to an external device, communication with electronics and/or memory disposed below the cap such as for uploading or downloading data, media, new or upgraded software, etc.) according to an embodiment of the present disclosure. As may be seen from FIG. 9A, each of light 182, switch 184, and jack 186 have electrical wiring 190, 192, 194, respectively, for connection to electrical element 128 (or other electronic components in a system associated therewith). Many wire routing options are possible, one example being to provide openings 196, 198, 200 in expansion washer 180, permitting wires 190, 192, 194 to be routed through expandable sleeve 142, threaded recess 132, and into canister 126 for connection to electronic element 128 disposed therein. Optionally, and as illustrated in FIG. 9C, compression cap bolt 172 (as well as expansion bolt 140) may be provided with an axial hollow region 183, permitting disposition of an electronic element 185 such as a user-viewable indicator light within compression cap bolt 172 (e.g., disposed below an hex-key receiving region 187), and permitting wiring 189 for electrical communication between such an electronic element and electrical element 128 to pass therein. It will be appreciated that the type, format, layout, location, number, etc. of any of the above lights 182, switches 184, jacks 186, and related wiring may differ from what is shown in FIGS. 9A and 9B and described herein without departing from the spirit and scope of the present disclosure.

Figure 10:
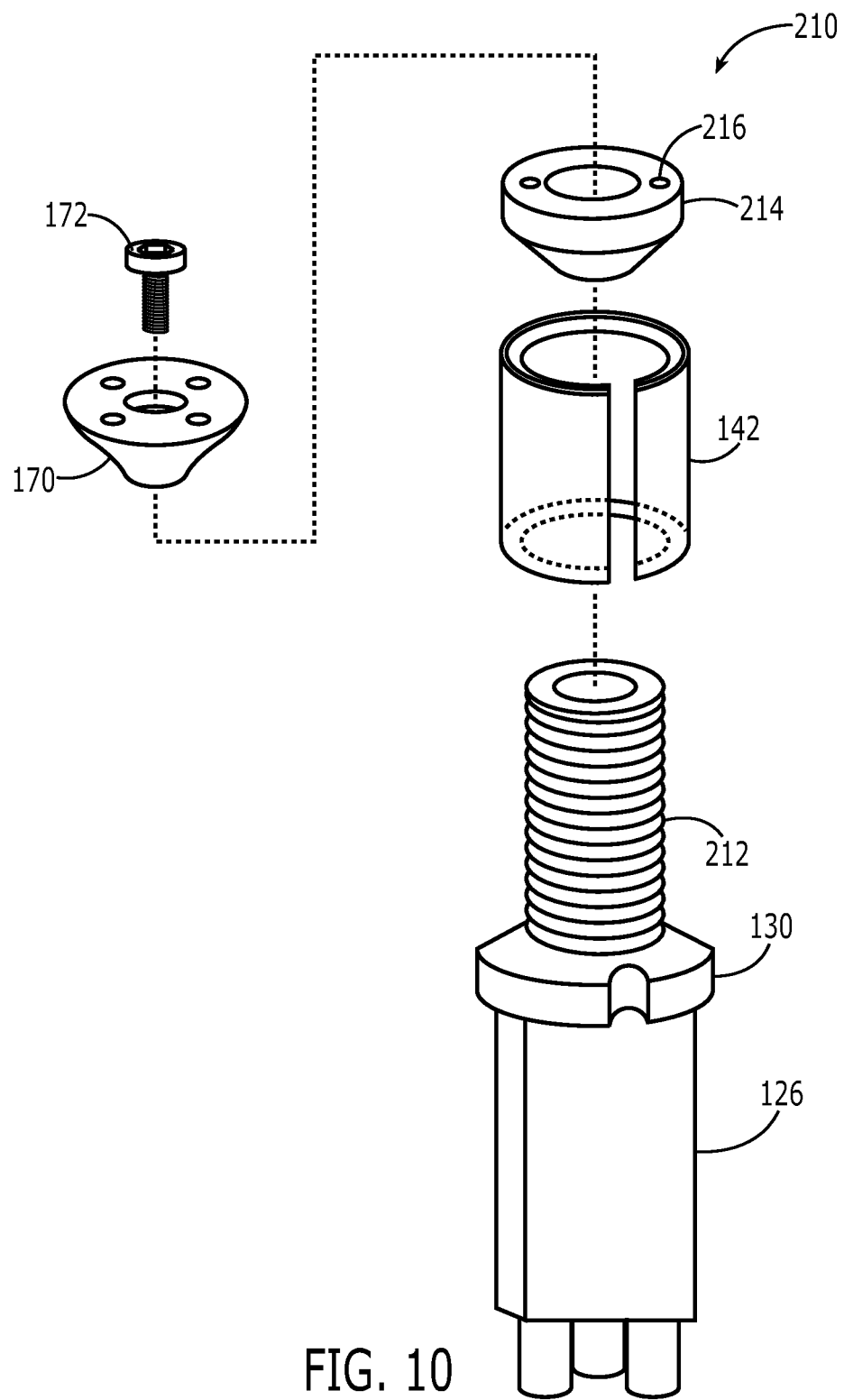
FIG. 10 is a perspective view of an apparatus for removably securing an electrical element within a tubular member within a frame element according to still another embodiment of the present disclosure.

FIG. 10 illustrates an embodiment 210 that is a variation of the previously described apparatus. Specifically, in place of a threaded bolt fitting into a threaded recess in the canister, embodiment 210 consists of a threaded extension 212 formed on a canister 126 and upper portion 130. In place of the bolt which fits into the threaded recess, a threaded nut 214 may be secured to threaded extension 212, in order to apply axial compression to expandable sleeve 142 to lock the assembly in place within a steerer tube. Threaded nut 214 may be tightened, hence compressing expandable sleeve 142 by way of a pin spanner or similar tool engaging recesses 216, or by other similar method. Other details of embodiment 210 may be as previously described.

Figure 11A:
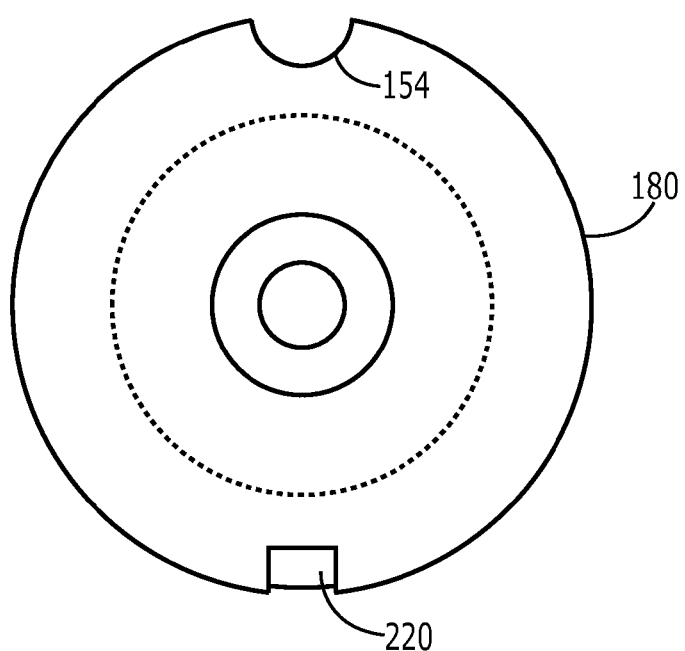
FIGS. 11A and 11B are plan- and side-views, respectively, of an expansion washer and steerer tube, with a rotation-prevention tab and notch, according to yet another embodiment of the present disclosure.
Figure 11B:
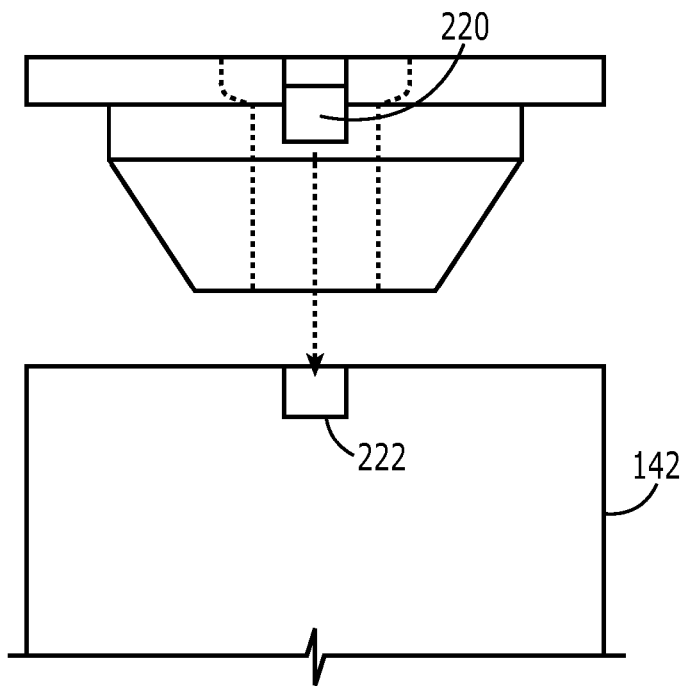

In certain embodiments it may be desirable to retain elements of assembly 122, such as expansion washer 180 in a fixed rotational position while assembling and securing various elements. With reference to FIGS. 11A and 11B, fixing rotational position may be provided with a stopping tab 220 sized and configured to engage a corresponding notch 222 in steerer 142. When assembled, tab 220 engages into notch 222 preventing rotation of cap 180 while bolt 140 (for example) secures the assembly together. One advantage provided by tab 220 and notch 222 is that wires routed through recess 154 do not twist during both mounting of assembly 122 within the steerer 142 and use of assembly 122 during operation of a bicycle.

According to embodiments of this disclosure, a separate and additional bolt for compression and retention is not required. Greater design freedom for the size and shape of the electronic subsystems within the steerer tube is provided. Additional components such as indicators (e.g., lights), actuators (e.g., switches), and connecting sockets may also therefore be provided.

According to embodiments of this disclosure, any threadless headset may be used, and in many embodiments, employing the design disclosed herein requires simply replacing the top cap and expander plug of otherwise standard headsets. Also according to embodiments of this disclosure, specially designed forks and stems may be employed that accommodate wiring for many different purposes in use.

No limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

While examples and variations have been presented in the foregoing description, it should be understood that a vast number of variations exist, and these examples are merely representative, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described examples may be made without departing from the spirit and scope of the disclosure defined by the claims thereto.

What is claimed is:

1. An apparatus for removably securing an electrical element within a tubular member within a frame element, comprising:
    an assembly, said assembly comprising:
        a canister for receiving said electrical element, said canister having a first end section having a tapered cross-section;
        an expandable sleeve, said expandable sleeve having a first end section having a tapered cross-section configured to receive the first end section of said canister;
        an expansion bolt configured and disposed to couple said canister and said expandable sleeve such that said expansion bolt may actuate compression of said expandable sleeve between said canister and said expandable sleeve to thereby enable securing of said assembly within said tubular member; and
    a preload cap, secured to said assembly such that said preload cap may engage and retain a bearing system to permit said tubular member to rotate relative to said frame element, said preload cap comprising a cap bolt and a compression body, and said expansion bolt comprising an internal threaded region configured to receive said cap bolt, such that said cap bolt may secure said compression body to said assembly relative to said frame element by engaging said internal threaded region of said expansion bolt when said assembly is secured to said tubular member and thereby retain a bearing assembly relative to said frame element to permit said tubular member to rotate relative to said frame element.

2. The apparatus of claim 1, wherein said expansion bolt is securely affixed to said first end of said canister, and said assembly further comprising an expansion nut having a first end having a tapered cross-section, said expandable sleeve having a second end, opposite said first end, having a tapered cross-section configured to receive the first end of said expansion nut.

3. The apparatus of claim 2, said canister further comprising a second end opposite said first end, said second end including at least one electrical connector to provide communicative coupling to said electrical element.

4. The apparatus of claim 3, wherein each of said first end of said canister and said expansion nut comprise at least one wire routing recess for receiving therein electrical wiring such that when said assembly is disposed within said tubular member said electrical wiring may pass from said canister through said wire routing recesses and exit between said expansion nut and said preload cap for providing communicative coupling to said electrical element.

5. The apparatus of claim 1, wherein said cap bolt comprises an axial hollow, and further comprising an electronic element disposed within said hollow such that at a first axial end of said hollow electrical wiring may be disposed within said hollow to permit electrical communication between said electronic element disposed within said hollow and said electrical element disposed within said canister, and at a second axial end opposite said first axial end a mechanism is provided for receiving and engaging a tightening tool for securing said cap bolt and a compression body to said assembly.

6. The apparatus of claim 1, wherein said canister further comprising a second end comprising a threaded portion and further wherein said preload cap comprises a threaded region configured to engage the threaded portion of said second end of said canister to thereby retain said preload cap relative to said assembly.

7. The apparatus of claim 6, further a central body portion of said canister disposed between said first and second ends, and still further comprising a cap ring disposed between said preload cap and a central body portion, said cap ring having disposed therein a set screw receiving region for receiving a set screw to retain said cap ring in a desired position relative to said assembly.

8. The apparatus of claim 6, further a central body portion of said canister disposed between said first and second ends, and still further comprising a cap ring disposed between said preload cap and a central body portion, said cap ring having disposed therein an electrical cable receiving region for receiving electrical wiring for providing communicative coupling to said electrical element.

9. The apparatus of claim 6, wherein said second end further comprises an indicator region having disposed therein at least one indicator configured to be communicatively coupled to said electrical element.

10. The apparatus of claim 9, said indicator region having disposed therein at least one switch configured to be communicatively coupled to said electrical element.

11. The apparatus of claim 9, said indicator region having disposed therein at least one communications port configured to be communicatively coupled to said electrical element.

12. The apparatus of claim 11, wherein said communications port is configured to receiving a charging connector for charging a power supply communicatively coupled to said electrical element.

13. The apparatus of claim 6, further comprising an expansion nut threaded and configured to engage said expansion bolt, and further wherein said second end further comprises at least one tool receiving recess configured and disposed therein to receive a tool for rotating said canister relative to said expansion nut to permit actuating said expandable sleeve to secure said assembly within said tubular member.

14. The apparatus of claim 1, further comprising an expansion washer having a first end having a substantially tapered cross-section, said expandable sleeve having a second end, opposite said first end, having a tapered cross-section configured to receive the first end of said expansion washer, said canister comprising a threaded bolt receiving region configured to receive said expansion bolt.

15. The apparatus of claim 1, wherein said apparatus is disposed within said tubular member such that electrical wiring from said electrical element is routed within said tubular member and through an opening in said tubular member for providing communicative coupling to said electrical element.

16. An apparatus for removably securing an electrical element within a tubular member within a frame element, comprising:
    an assembly, said assembly comprising:
        a canister for receiving said electrical element;
        an expansion region coupled to a first end of said canister, having a conical cross-section;
        an expansion bolt coupled to said expansion region;

an expansion nut threadably and adjustably connected to said expansion bolt, said expansion nut having a first end having a conical cross-section;

an expandable sleeve, disposed between said first end of said expansion bolt and said first end of said expansion nut, said expansion bolt extending axially through said expandable sleeve, said expandable sleeve having first and second end sections each having a conical cross-section configured to receive said first end of said expansion region and said first end of said expansion nut, respectively;

wherein, said expansion bolt and said expansion nut are configured and disposed to actuate compression of said expandable sleeve to thereby enable securing of said assembly within said tubular member; and a preload cap, secured to said assembly such that said preload cap may engage and retain a bearing system to permit said tubular member to rotate relative to said frame element, said preload cap comprising a cap bolt and a compression body, and said expansion bolt comprising an internal threaded region configured to receive said cap bolt, such that said cap bolt may secure said compression body to said assembly relative to said frame element when said assembly is secured to said tubular member and thereby retain a bearing assembly relative to said frame element.

17. The apparatus of claim 16, said canister further comprising a second end opposite said first end, said second end including at least one electrical connector to provide communicative coupling to said electrical element.

18. The apparatus of claim 16, wherein said canister further comprising a second end comprising a threaded portion and further wherein said preload cap comprises a threaded region configured to engage the threaded portion of said second end of said canister to thereby retain said preload cap relative to said assembly.

19. An apparatus for removably securing an electrical element within a tubular member within a frame element, comprising:

an assembly, said assembly comprising:
a canister for receiving said electrical element;
a first expansion washer coupled to a first end of said canister, having a first end with a conical cross-section and a centrally disposed bolt receiving region;
a second expansion washer having a first end having a conical cross-section;
an expandable sleeve, disposed between said first and second expansion washers, said expandable sleeve having first and second end sections each having a conical cross-section configured to receive said first ends of said first and second expansion washers, respectively;
an expansion bolt threadably and adjustably connected to said bolt receiving region and extending axially through said second expansion washer and said expandable sleeve, said expansion bolt comprising an internal threaded region;
wherein, said first and second expansion washers are configured and disposed such that actuation of said expansion bolt relative to said bolt receiving region produces compression of said expandable sleeve to thereby enable securing of said assembly within said tubular member; and a preload cap, wherein said preload cap comprises a cap bolt and a compression body, such that said cap bolt may secure said compression body to said assembly relative to said frame element by engaging said internal threaded region of said expansion bolt when said assembly is secured to said tubular member and thereby retain a bearing assembly relative to said frame element to permit said tubular member to rotate relative to said frame element.

* * * * *